(12) United States Patent
Huang

(10) Patent No.: US 9,698,381 B1
(45) Date of Patent: Jul. 4, 2017

(54) MANUFACTURING METHOD FOR ORGANIC ELECTROLUMINESCENT DEVICE AND ORGANIC ELECTROLUMINESCENT DEVICE

(71) Applicant: Shenzhen China Star Optoelectronics Technology Co., Ltd., Shenzhen (CN)

(72) Inventor: Hui Huang, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 179 days.

(21) Appl. No.: 14/778,611

(22) PCT Filed: Aug. 24, 2015

(86) PCT No.: PCT/CN2015/087961
§ 371 (c)(1),
(2) Date: Sep. 21, 2015

(87) PCT Pub. No.: WO2017/020368
PCT Pub. Date: Feb. 9, 2017

(30) Foreign Application Priority Data

Aug. 3, 2015 (CN) .......................... 2015 1 0484300

(51) Int. Cl.
H01L 51/56 (2006.01)
H01L 51/52 (2006.01)
H01L 51/50 (2006.01)
(52) U.S. Cl.
CPC ...... H01L 51/5268 (2013.01); H01L 51/5056 (2013.01); H01L 51/5072 (2013.01);
(Continued)

(58) Field of Classification Search
None
See application file for complete search history.

(56) References Cited

U.S. PATENT DOCUMENTS

2005/0109385 A1* 5/2005 Kim .................. B82Y 30/00
136/252
2006/0148066 A1* 7/2006 Senecal ............. B01D 39/1623
435/287.2
(Continued)

FOREIGN PATENT DOCUMENTS

CN 103311447 A * 9/2013 ............. H01L 51/56
CN 103378309 A 10/2013
CN 104140124 A * 11/2014 ........... C01G 23/053

Primary Examiner — Michael Lebentritt
Assistant Examiner — Jordan Klein
(74) Attorney, Agent, or Firm — Leong C. Lei

(57) ABSTRACT

A manufacturing method for an organic electroluminescent device disposes a scattering layer between a substrate and an anode. The scattering layer is made of a titanium dioxide film, and the titanium dioxide film is formed by an electrospinning process. The density and thickness of an electrospun membrane can be adjusted through a voltage and a distance between electrodes during the electrospinning process. The process parameters are easy to be adjusted and operability is increased to effectively improve a light efficiency. When a light exit from the anode and enter into the substrate inside the device, the scattering layer will scatter the light to change a light path within a critical angle of a total reflection in order to reduce an incident angle. Accordingly, a light which is supposed to be total reflected will be refracted so as to improve the light efficiency.

14 Claims, 5 Drawing Sheets

(52) U.S. Cl.
CPC ...... *H01L 51/5088* (2013.01); *H01L 51/5092* (2013.01); *H01L 51/5212* (2013.01); *H01L 51/56* (2013.01)

(56) References Cited

U.S. PATENT DOCUMENTS

| | | | |
|---|---|---|---|
| 2007/0116640 A1* | 5/2007 | Kim ....................... | B82Y 30/00 423/610 |
| 2008/0278067 A1* | 11/2008 | Tyan ..................... | B82Y 20/00 313/504 |
| 2010/0270161 A1* | 10/2010 | Hyun .................... | B82Y 30/00 204/665 |
| 2011/0064936 A1* | 3/2011 | Hammond-Cunningham ....... | B01D 53/228 428/306.6 |
| 2011/0287926 A1* | 11/2011 | Lalman ................. | B01J 21/063 502/5 |
| 2012/0186645 A1* | 7/2012 | Shin ..................... | H01G 9/209 136/256 |
| 2012/0305068 A1* | 12/2012 | Chao .................... | H01G 9/2031 136/256 |
| 2013/0062796 A1* | 3/2013 | Coughlin ......... | B29D 11/00346 264/1.7 |
| 2016/0064693 A1* | 3/2016 | Moon ................. | G02B 5/0268 257/40 |
| 2016/0301024 A1* | 10/2016 | He ..................... | H01L 51/5096 |

* cited by examiner

MANUFACTURING METHOD FOR ORGANIC ELECTROLUMINESCENT DEVICE AND ORGANIC ELECTROLUMINESCENT DEVICE

BACKGROUND OF THE INVENTION

1. Field of the Invention

The present invention relates to an electric light technology field, and more particularly to a manufacturing method for an organic electroluminescent device, and an organic electroluminescent device.

2. Description of Related Art

Currently, in the illumination and display field, an Organic Light-Emitting Diode (OLED) is widely applied in an illumination product and a display panel because of characteristics of a low starting voltage, thin, self-illumination, and so on in order to meet the requirements of low energy consumption, self-illumination, and surface light source and so on.

In the display panel industry, comparing with the conventional Thin Film Transistor-Liquid Crystal Display (TFT-LCD), an OLED device has a very excellent display performance. Specifically, features of self-illumination, simple structure, ultra-thin, fast response, wide viewing angle, low power consumption and can realize flexible display and so on. Therefore, the OLED device has been called as "Dream display". Besides, the cost of the production equipment is less than the LCD display device so that the OLED device has become a mainstream of the third-generation display in the display technology field. Currently, the OLED device is ready for a mass production. With further research and new technologies continuing to emerge, the OLED device will have a breakthrough development.

As shown in FIG. 1, an OLED device sequentially has an anode 200, an organic light emitting layer 300 and a cathode 400 sequentially disposed on a substrate 100. The substrate 100 is a light-exiting surface, and paths for a light to exit usually are: the organic light emitting layer 300, the anode 200, the substrate 100 and an air. A light emitted by the organic light emitting layer 300 passes through above four paths to reach the air, and enters eyes of a human. The organic light emitting layer 300 is made of a small organic molecule material, and the refractive index is about 1.6-1.7. The anode 200 is made of an indium-tin-oxide (ITO) thin film, and the refractive index is about 1.8. The substrate 100 is a glass substrate, and the refractive index is 1.5. The refractive index of the air is 1.0. Accordingly, in light propagation processes from ITO anode 200 having the refractive index 1.8 to the glass substrate having the refractive index 1.5, and from the glass substrate having the refractive index 1.5 to the air having the refractive index 1.0, a light is propagated from an optically dense medium to an optically thinner medium. Therefore, a total reflection phenomenon is existed. A light having an incident angle greater than a critical cannot reach the glass substrate because of the total reflection phenomenon. The light which cannot reach the glass substrate will be absorbed internally and lost. Currently, a conventional OLED device only has a light emitting efficiency about 17%, and most of the light is lost because of the total reflection at the interfaces.

SUMMARY OF THE INVENTION

The purpose of the present invention is to provide a manufacturing method for an organic electroluminescent device, wherein a scattering layer is disposed between a substrate and an anode so as to increase a light efficiency of the organic electroluminescent device. Besides, the scattering layer is made of a titanium dioxide film obtained by an electrospinning process. Comparing with other method such as a hydrothermal method for forming a titanium-dioxide film, the process conditions are more easily to control, and the operability is high.

Another purpose of the present invention is to provide an organic electroluminescent device, which can reduce the total reflection during a process that emission lights inside the device propagate to the substrate in order to improve a light efficiency.

In order to achieve above purpose, the present invention provides a manufacturing method for an organic electroluminescent device, comprising following steps: step 1: dissolving an alkyl titanate and a pyrrole polymer into a solvent in order to formulate a solution so as to obtain a spinning solution; step 2: providing a stainless steel mesh, using the spinning solution to perform electrospinning on the stainless steel mesh, and obtaining an electrospun membrane containing titanium located on the stainless steel mesh; step 3: after drying, tearing off the electrospun membrane containing titanium from the stainless steel mesh; step 4: providing a substrate, adhering the electrospun membrane containing titanium to the substrate, performing a baking process at a temperature ranging from 300° C. to 700° C. such that the electrospun membrane containing titanium is converted to a titanium dioxide film in order to obtain a scattering layer located on the substrate; and step 5: sequentially forming an anode, an organic electroluminescent structure, and a cathode on the scattering layer and above the substrate in order to obtain an organic electroluminescent device.

Wherein, in the step 1, the alkyl titanate is tetrabutyl titanate, the pyrrole polymer is polypyrrole or polyvinylpyrrolidone; the solvent is water, methanol, ethanol, or butanol.

Wherein, the step 1 further includes a step of: adding polyethylene glycol into the spinning solution.

Wherein, in the step 2, a voltage applied during electrospinning ranges from 20 kV to 50 kV, a receiving distance during electrospinning ranges from 10 cm to 30 cm, a thickness of the electrospun membrane containing titanium is not greater than 10 μm, and a thickness of the scattering layer obtained in the step 4 is not greater than 10 μm.

Wherein, in the step 4, the baking process is performed at a temperature ranging from 400° C. to 600° C.

Wherein, in the step 4, the substrate is a glass substrate.

Wherein, in the step 5, the anode is formed on the scattering layer and above the substrate through a sputtering process; the organic electroluminescent structure and a cathode are formed on the anode, and above the scattering layer and the substrate through an evaporation process.

The present invention also provides an organic electroluminescent device, produced by the manufacturing method for an organic electroluminescent device as stated above, and comprises: a substrate; and a scattering layer, an anode, an organic electroluminescent structure and a cathode sequentially stacked on the substrate; wherein, the scattering layer is made of a titanium dioxide film.

Wherein, the anode is made of indium tin oxide (ITO), and the cathode is made of metal or alloy metal.

Wherein, the organic electroluminescent structure includes a hole injection layer, a hole transport layer, an organic light emitting layer, an electron transport layer, and an electron injection layer.

The present invention also provides a manufacturing method for an organic electroluminescent device, comprising following steps: step 1: dissolving an alkyl titanate and a pyrrole polymer into a solvent in order to formulate a solution so as to obtain a spinning solution; step 2: providing a stainless steel mesh, using the spinning solution to perform electrospinning on the stainless steel mesh, and obtaining an electrospun membrane containing titanium located on the stainless steel mesh; step 3: after drying, tearing off the electrospun membrane containing titanium from the stainless steel mesh; step 4: providing a substrate, adhering the electrospun membrane containing titanium to the substrate 10, performing a baking process at a temperature ranging from 300° C. to 700° C. such that the electrospun membrane containing titanium is converted to a titanium dioxide film in order to obtain a scattering layer located on the substrate; and step 5: sequentially forming an anode, an organic electroluminescent structure, and a cathode on the scattering layer and above the substrate in order to obtain an organic electroluminescent device; wherein, in the step 1, the alkyl titanate is tetrabutyl titanate, the pyrrole polymer is polypyrrole or polyvinylpyrrolidone; the solvent is water, methanol, ethanol, or butanol; wherein, in the step 2, a voltage applied during electrospinning ranges from 20 kV to 50 kV, a receiving distance during electrospinning ranges from 10 cm to 30 cm, a thickness of the electrospun membrane containing titanium is not greater than 10 μm, and a thickness of the scattering layer obtained in the step 4 is not greater than 10 μm; and wherein, in the step 5, the anode is formed on the scattering layer and above the substrate through a sputtering process; the organic electroluminescent structure and a cathode are formed on the anode, and above the scattering layer and the substrate through an evaporation process.

The beneficial effects of the present invention: a manufacturing method for an organic electroluminescent device of the present invention disposes a scattering layer between a substrate and an anode. The scattering layer is made of a titanium dioxide film, and the titanium dioxide film is obtained through transferring an electrospun membrane containing titanium by an electrospinning process on the substrate and a baking process. The electrospinning process is beneficial for improving the film formability. The uniformity of the electrospun membrane formed through electrospinning is higher. The density and thickness of an electrospun membrane can be adjusted through a voltage and a distance between electrodes during the electrospinning process. The electrospun membrane containing titanium is easily to be transferred to other substrates, and the operability is increased to effectively improve a light efficiency. Comparing with other method such as a hydrothermal method for forming a titanium-dioxide film, the process conditions are more easily to control. When a light exit from the anode and enter into the substrate inside the device, the scattering layer will scatter the light to change a light path within a critical angle of a total reflection in order to reduce an incident angle. Accordingly, a light which is supposed to be total reflected will be refracted so as to improve the light efficiency.

DETAILED DESCRIPTION OF THE PREFERRED EMBODIMENT

The following content combines with the drawings and the embodiment for describing the present invention in detail. It is obvious that the following embodiments are only some embodiments of the present invention. For the person of ordinary skill in the art without creative effort, the other embodiments obtained thereby are still covered by the present invention.

Figure 1:
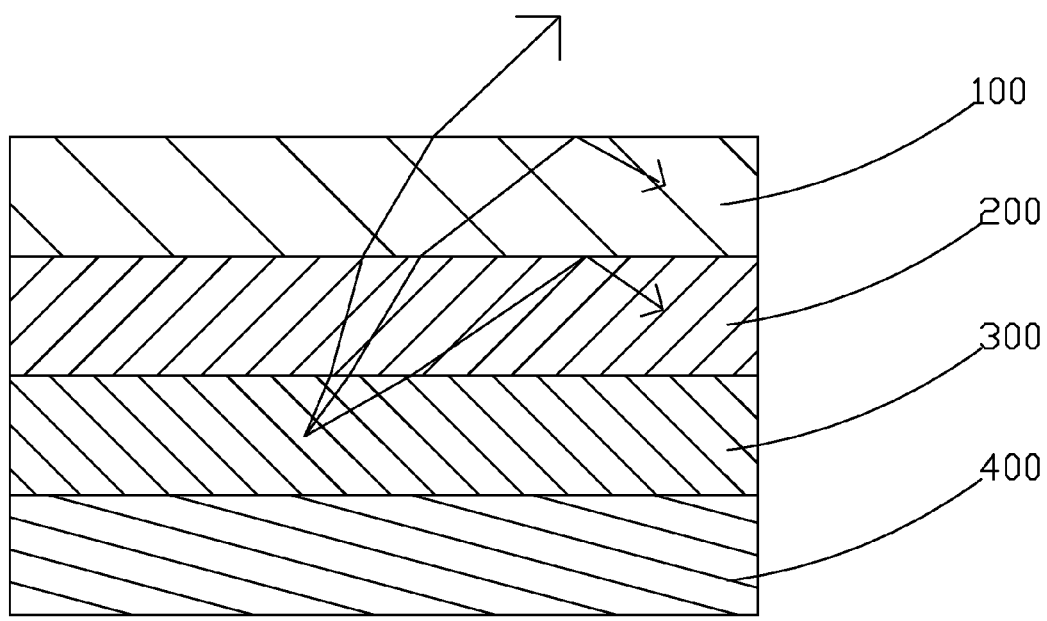
FIG. 1 is a schematic diagram of a light propagation path inside a bottom-emitting type organic electroluminescent device according to the conventional art.
Figure 2:
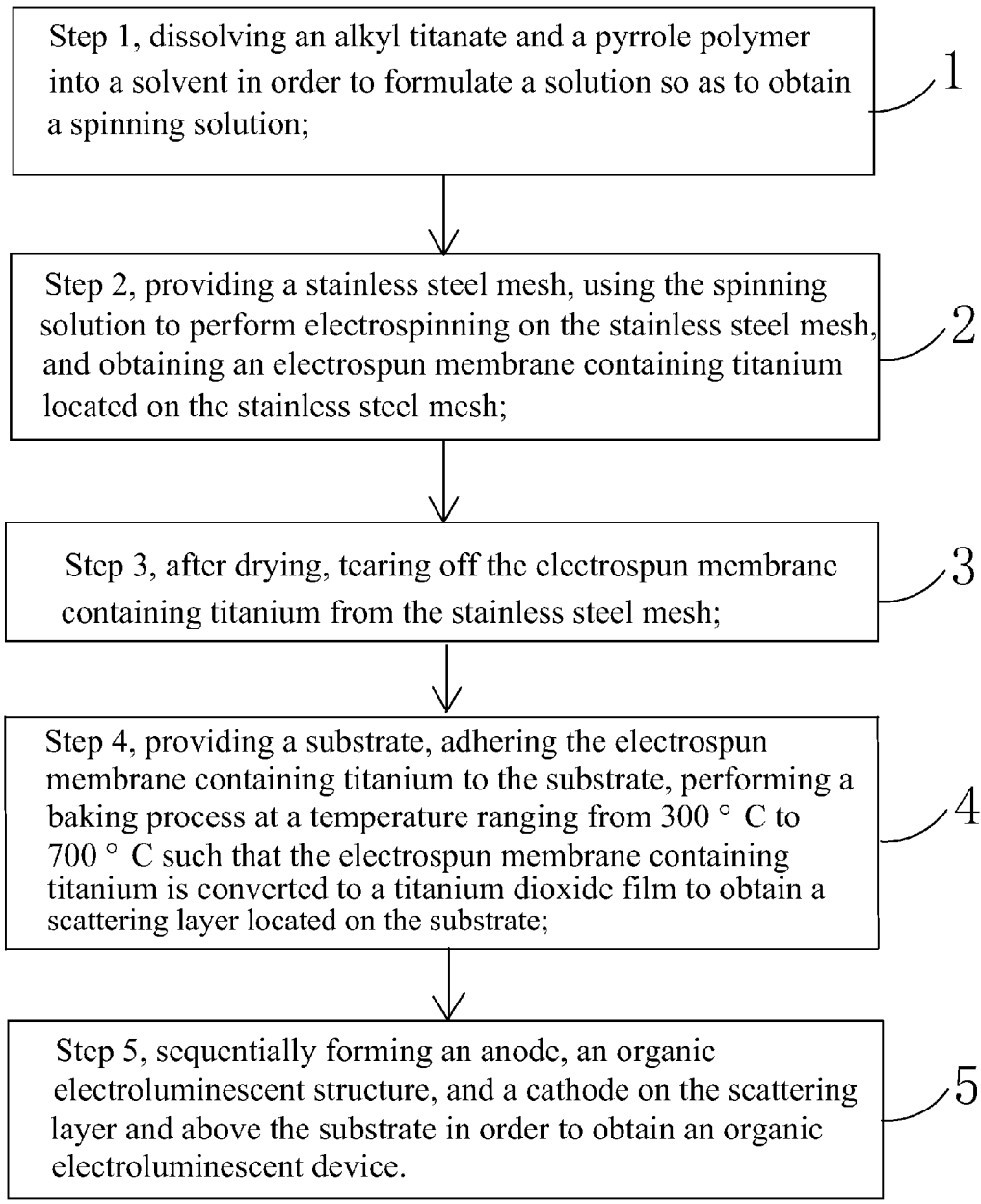
FIG. 2 is a flow chart of a manufacturing method for an organic electroluminescent device according to the present invention.

With reference to FIG. 2, the present invention provides a manufacturing method for an organic electroluminescent device, comprising following steps:

Step 1: weighting alkyl titanate and pyrrole polymer, and dissolving the alkyl titanate and the pyrrole polymer in a solvent in order to formulate a solution so as to obtain a spinning solution.

Specifically, in the step 1, preferably, the alkyl titanate is tetrabutyl titanate, and the pyrrole polymer is polypyrrole or polyvinylpyrrolidone. The solvent is water, a methanol, an ethanol, a butanol, or other hydrophilic solvents.

Specifically, polyethylene glycol may be added into the spinning solution in order to modify an internal structure of an electrospun membrane formed subsequently.

Figure 3:
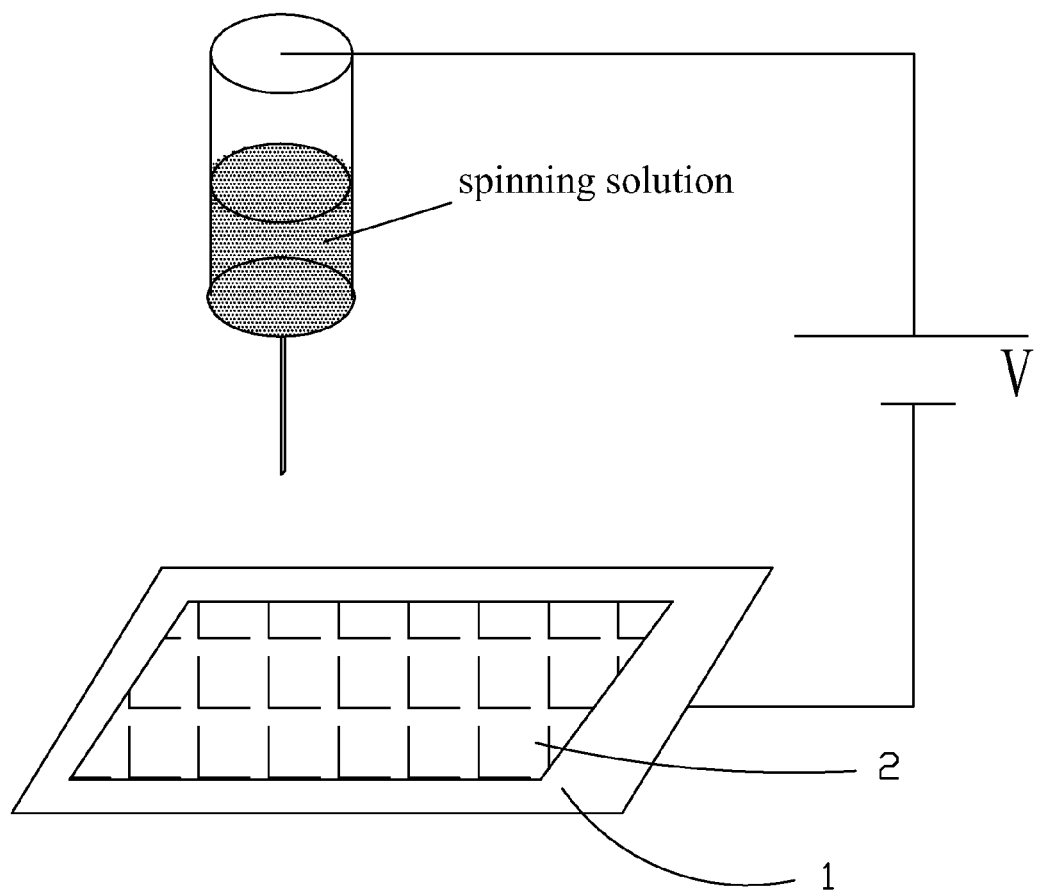
FIG. 3 is a schematic diagram of a step 2 in the manufacturing method for an organic electroluminescent device according to the present invention.

In a step 2, as shown in FIG. 3, providing a stainless steel mesh 1, using the stainless steel mesh 1 as a base, using the spinning solution to perform electrospinning on the stainless steel mesh 1, and obtaining an electrospun membrane containing titanium located on the stainless steel mesh 1.

Specifically, in the step 2, a voltage applied during electrospinning ranges from 20 kV to 50 kV. A receiving distance (that is, a distance between a spinning needle and the stainless steel mesh 1 is ranged from 10 cm to 30 cm. A thickness of a titanium dioxide film obtained is not greater than 10 μm.

Specifically, using the stainless steel mesh as a base for electrospinning, because the stainless steel mesh is a mesh structure, comparing to other substrates (such as polyethylene terephthalate (PET) or glass), a finished electrospun membrane is easily to be torn off so that the finished electrospun film is convenient to be transferred to other substrates, and the finished electrospun membrane will not be broken at the same time.

Figure 4:
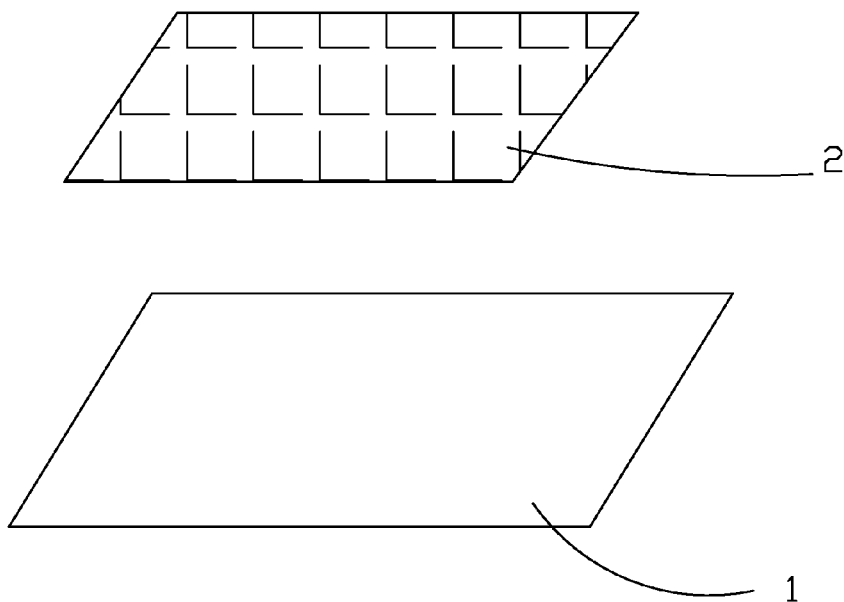
FIG. 4 is a schematic diagram of a step 3 in the manufacturing method for an organic electroluminescent device according to the present invention.

Step 3: as shown in FIG. 4, after drying, tearing off the electrospun membrane 2 containing titanium from the stainless steel mesh 1;

Specifically, after drying, infiltrating the electrospun membrane 2 containing titanium according to a requirement in order to facilitate tearing off the electrospun membrane 2 containing titanium from the stainless steel mesh 1.

Figure 5:
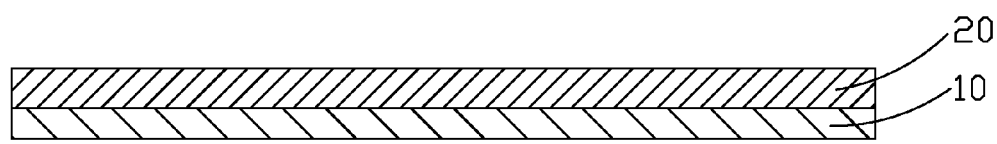
FIG. 5 is a schematic diagram of a step 4 in the manufacturing method for an organic electroluminescent device according to the present invention.

Step 4: as shown in FIG. 5, providing a substrate 10, adhering the electrospun membrane 2 containing titanium on the substrate 10, performing a baking process at a temperature ranging from 300° C. to 700° C. in order to obtain a scattering layer 20 located on the substrate 10;

Specifically, in the step 4, after the electrospun membrane 2 containing titanium is baked at the high temperature (300° C. to 700° C.), the electrospun membrane 2 containing titanium has been converted into a titanium dioxide film having pure and single titanium dioxide crystals in order to obtain the scattering layer 20 located on the substrate 10.

Specifically, a crystallinity of titanium dioxide can be changed by adjusting a baking temperature. Preferably, the baking process is performed at a temperature ranging from 400° C. to 600° C. to bake the electrospun membrane 2 containing titanium adhered on the substrate 10.

Specifically, a thickness of the titanium dioxide film after baking at the high temperature (300° C. to 700° C. or 400° C. to 600° C.) is not greater 10 μm, that is, the scattering layer 20 located on the substrate 10 is not greater than 10 μm.

Specifically, in the step 4, the substrate 10 is a glass substrate.

Figure 6:
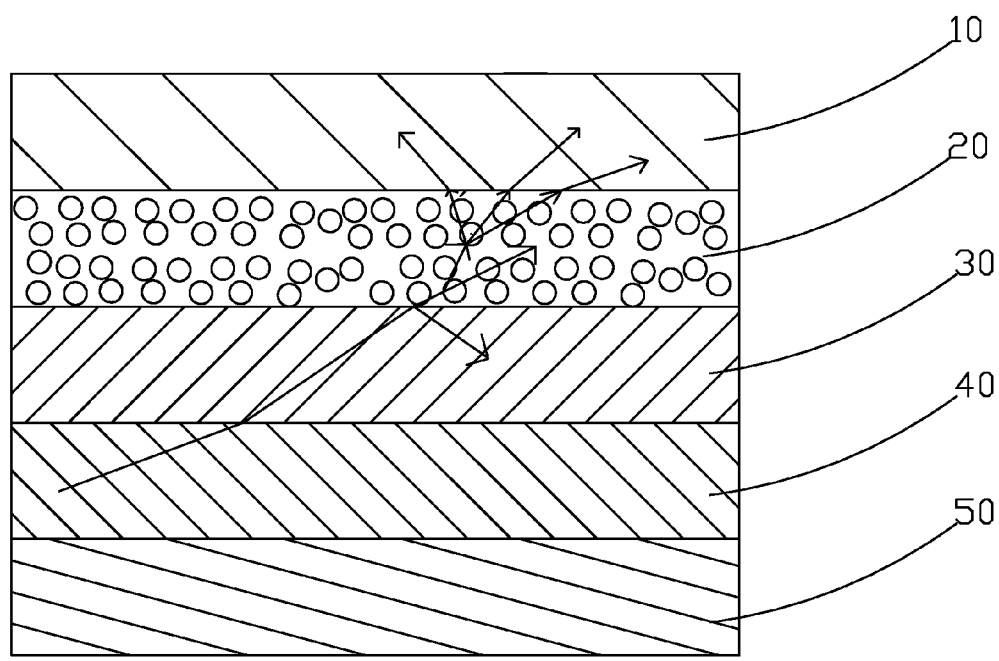
FIG. 6 is a schematic diagram of a step 5 in the manufacturing method for an organic electroluminescent device and a cross-sectional view according to the present invention.

Step 5: as shown in FIG. 6, above the substrate 10 and on the scattering layer 20, an anode 30, an organic electroluminescent structure 40, and a cathode 50 are sequentially formed in order to obtain an organic electroluminescent device.

Specifically, in the step 5, the anode 30 is formed on the scattering layer 20 and above the substrate 10 through a sputtering process. The organic electroluminescent structure 40 and a cathode 50 are formed on the anode 30, above the scattering layer 20 and the substrate 10 through an evaporation process.

A manufacturing method for an organic electroluminescent device of the present invention disposes a scattering layer between a substrate and an anode. The scattering layer is made of a titanium dioxide film, and the titanium dioxide film is obtained through transferring an electrospun membrane containing titanium by an electrospinning process on the substrate and a baking process. The electrospinning process is beneficial for improving the film formability. The uniformity of the electrospun membrane formed through electrospinning is higher. The density and thickness of an electrospun membrane can be adjusted through a voltage and a distance between electrodes during the electrospinning process. The electrospun membrane containing titanium is easily to be transferred to other substrates, and the operability is increased to effectively improve a light efficiency. Comparing with other method such as a hydrothermal method for forming a titanium-dioxide film, the process conditions are more easily to control. When a light exit from the anode and enter into the substrate inside the device, the scattering layer will scatter the light to change a light path within a critical angle of a total reflection in order to reduce an incident angle. Accordingly, a light which is supposed to be total reflected will be refracted so as to improve the light efficiency.

According to the manufacturing method for an organic electroluminescent device, as shown in FIG. 6, the present invention also provides an organic electroluminescent device, comprising: a substrate 10, and a scattering layer 20, an anode 30, an organic electroluminescent structure 40 and a cathode 50 sequentially stacked on the substrate 10.

Wherein, the scattering layer 20 is made of a titanium dioxide film.

Specifically, a thickness of the scattering layer 20 is not greater than 10 μm.

Specifically, the anode 30 is made of indium-tin-oxide (ITO).

Specifically, the organic electroluminescent structure 40 includes a hole injection layer, a hole transport layer, an organic light emitting layer, an electron transport layer, and an electron injection layer.

Specifically, the cathode 50 is made of metal or alloy metal.

The organic electroluminescent device of the present invention disposes a scattering layer 20 between a substrate 10 and an anode 30. The scattering layer is made of a titanium dioxide film, and the titanium dioxide film is formed by an electrospinning process. The density and thickness of an electrospun membrane can be adjusted. When a light exited from the anode and enters into the substrate inside the device, the scattering layer will scatter the light to change a light path within a critical angle of a total reflection in order to reduce an incident angle. Accordingly, a light which is supposed to be total reflected will be refracted so as to improve the light efficiency.

In summary, a manufacturing method for an organic electroluminescent device of the present invention disposes a scattering layer between a substrate and an anode. The scattering layer is made of a titanium dioxide film, and the titanium dioxide film is obtained through transferring an electrospun membrane containing titanium by an electrospinning process on the substrate and a baking process. The electrospinning process is beneficial for improving the film formability. The uniformity of the electro spun membrane formed through electrospinning is higher. The density and thickness of an electrospun membrane can be adjusted through a voltage and a distance between electrodes during the electrospinning process. The electrospun membrane containing titanium is easily to be transferred to other substrates, and the operability is increased to effectively improve a light efficiency. Comparing with other method such as a hydrothermal method for forming a titanium-dioxide film, the process conditions are more easily to control. When a light exit from the anode and enter into the substrate inside the device, the scattering layer will scatter the light to change a light path within a critical angle of a total reflection in order to reduce an incident angle. Accordingly, a light which is supposed to be total reflected will be refracted so as to improve the light efficiency.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A manufacturing method for an organic electroluminescent device, comprising following steps:
   step 1: dissolving an alkyl titanate and a pyrrole polymer into a solvent in order to formulate a solution so as to obtain a spinning solution;
   step 2: providing a stainless steel mesh, using the spinning solution to perform electrospinning on the stainless steel mesh, and obtaining an electrospun membrane containing titanium located on the stainless steel mesh;
   step 3: after drying, tearing off the electrospun membrane containing titanium from the stainless steel mesh;
   step 4: providing a substrate, adhering the electrospun membrane containing titanium to the substrate, performing a baking process at a temperature ranging from 300° C. to 700° C. such that the electrospun membrane containing titanium is converted to a titanium dioxide film in order to obtain a scattering layer located on the substrate; and step 5: sequentially forming an anode, an organic electroluminescent structure, and a cathode on the scattering layer and above the substrate in order to obtain an organic electroluminescent device.

2. The manufacturing method for an organic electroluminescent device according to claim 1, wherein, in the step 1, the alkyl titanate is tetrabutyl titanate, the pyrrole polymer is polypyrrole or polyvinylpyrrolidone; the solvent is water, methanol, ethanol, or butanol.

3. The manufacturing method for an organic electroluminescent device according to claim 1, wherein, the step 1 further includes a step of: adding polyethylene glycol into the spinning solution.

4. The manufacturing method for an organic electroluminescent device according to claim 1, wherein, in the step 2, a voltage applied during electrospinning ranges from 20 kV to 50 kV, a receiving distance during electrospinning ranges from 10 cm to 30 cm, a thickness of the electrospun membrane containing titanium is not greater than 10 μm, and a thickness of the scattering layer obtained in the step 4 is not greater than 10 μm.

5. The manufacturing method for an organic electroluminescent device according to claim 1, wherein, in the step 4, the baking process is performed at a temperature ranging from 400° C. to 600° C.

6. The manufacturing method for an organic electroluminescent device according to claim 1, wherein, in the step 4, the substrate is a glass substrate.

7. The manufacturing method for an organic electroluminescent device according to claim 1, wherein, in the step 5, the anode is formed on the scattering layer and above the substrate through a sputtering process; the organic electroluminescent structure and a cathode are formed on the anode, and above the scattering layer and the substrate through an evaporation process.

8. An organic electroluminescent device, wherein the organic electroluminescent device is produced by the manufacturing method for an organic electroluminescent device as claimed in claim 1, and comprises:
a substrate; and
a scattering layer, an anode, an organic electroluminescent structure and a cathode sequentially stacked on the substrate;
wherein, the scattering layer is made of a titanium dioxide film.

9. The organic electroluminescent device according to claim 8, wherein, the anode is made of indium tin oxide (ITO), and the cathode is made of metal or alloy metal.

10. The organic electroluminescent device according to claim 8, wherein, the organic electroluminescent structure includes a hole injection layer, a hole transport layer, an organic light emitting layer, an electron transport layer, and an electron injection layer.

11. A manufacturing method for an organic electroluminescent device, comprising following steps:
step 1: dissolving an alkyl titanate and a pyrrole polymer into a solvent in order to formulate a solution so as to obtain a spinning solution;
step 2: providing a stainless steel mesh, using the spinning solution to perform electrospinning on the stainless steel mesh, and obtaining an electrospun membrane containing titanium located on the stainless steel mesh;
step 3: after drying, tearing off the electrospun membrane containing titanium from the stainless steel mesh;
step 4: providing a substrate, adhering the electrospun membrane containing titanium to the substrate 10, performing a baking process at a temperature ranging from 300° C. to 700° C. such that the electrospun membrane containing titanium is converted to a titanium dioxide film in order to obtain a scattering layer located on the substrate; and
step 5: sequentially forming an anode, an organic electroluminescent structure, and a cathode on the scattering layer and above the substrate in order to obtain an organic electroluminescent device;
wherein, in the step 1, the alkyl titanate is tetrabutyl titanate, the pyrrole polymer is polypyrrole or polyvinylpyrrolidone; the solvent is water, methanol, ethanol, or butanol;
wherein, in the step 2, a voltage applied during electrospinning ranges from 20 kV to 50 kV, a receiving distance during electrospinning ranges from 10 cm to 30 cm, a thickness of the electrospun membrane containing titanium is not greater than 10 μm, and a thickness of the scattering layer obtained in the step 4 is not greater than 10 μm; and
wherein, in the step 5, the anode is formed on the scattering layer and above the substrate through a sputtering process; the organic electroluminescent structure and a cathode are formed on the anode, and above the scattering layer and the substrate through an evaporation process.

12. The manufacturing method for an organic electroluminescent device according to claim 11, wherein, the step 1 further includes a step of: adding polyethylene glycol into the spinning solution.

13. The manufacturing method for an organic electroluminescent device according to claim 11, wherein, in the step 4, the baking process is performed at a temperature ranging from 400° C. to 600° C.

14. The manufacturing method for an organic electroluminescent device according to claim 11, wherein, in the step 4, the substrate is a glass substrate.

* * * * *